US008169811B2

United States Patent
Li et al.

(10) Patent No.: US 8,169,811 B2
(45) Date of Patent: May 1, 2012

(54) NON-VOLATILE RE-PROGRAMMABLE MEMORY DEVICE

(75) Inventors: Yuan Li, Malden (NL); Guoqiao Tao, Nijmegen (NL)

(73) Assignee: NXP B.V., Eindhoven (NL)

( * ) Notice: Subject to any disclaimer, the term of this patent is extended or adjusted under 35 U.S.C. 154(b) by 15 days.

(21) Appl. No.: 12/835,588

(22) Filed: Jul. 13, 2010

(65) Prior Publication Data
US 2012/0014160 A1   Jan. 19, 2012

(51) Int. Cl.
*G11C 11/00* (2006.01)
(52) U.S. Cl. .................... 365/148; 365/230.03
(58) Field of Classification Search .................. 365/148, 365/230.03
See application file for complete search history.

(56) References Cited

U.S. PATENT DOCUMENTS

| 5,623,594 | A * | 4/1997 | Swamy | 714/1 |
| 6,804,154 | B2 * | 10/2004 | Kitagawa et al. | 365/189.09 |
| 6,835,591 | B2 * | 12/2004 | Rueckes et al. | 438/99 |
| 7,006,341 | B2 * | 2/2006 | Nishino | 361/103 |
| 7,292,133 | B2 * | 11/2007 | Kato | 338/195 |
| 7,365,632 | B2 * | 4/2008 | Bertin et al. | 338/195 |
| 8,068,358 | B2 * | 11/2011 | Maejima | 365/148 |
| 2006/0181388 | A1 * | 8/2006 | Chinthakindi et al. | 338/309 |
| 2007/0019489 | A1 * | 1/2007 | Herbert et al. | 365/211 |
| 2007/0077664 | A1 * | 4/2007 | Chung et al. | 438/2 |
| 2009/0091996 | A1 * | 4/2009 | Chen et al. | 365/212 |
| 2011/0007548 | A1 * | 1/2011 | Jung et al. | 365/148 |

FOREIGN PATENT DOCUMENTS
WO    2006017416  A2    2/2006

OTHER PUBLICATIONS

Partial European Search Report (EESR), for EP Application 11173262.4 dated Oct. 13, 2011.

* cited by examiner

*Primary Examiner* — Michael Tran

(57) ABSTRACT

A memory device including a non-volatile re-programmable memory cell is provided. In connection with various example embodiments, the memory cell is a single resistor located between a first and second node. The resistor stores different resistance states corresponding to different resistance values set by SiCr-facilitated migration. The SiCr-facilitated migration occurs in response to energy presented between the first and second nodes. The application of a signal to a first node of the memory cell resistor forces the migration of elements along the memory cell resistor to set the resistance value of the memory cell resistor. The application of a second signal of approximately equal strength to the second node reverses the change and resistance and returns the memory cell to the previous resistance level. In some implementations the resistor is made of SiCr.

19 Claims, 5 Drawing Sheets

NON-VOLATILE RE-PROGRAMMABLE MEMORY DEVICE

Non-volatile re-programmable memory is frequently semiconductor device based, such as used in EEprom or Flash memory. For semiconductor based memory, each memory cell may include multiple transistors, limiting the reduction in size achievable. In addition the transistors are added to the semiconductor during front end processing.

In many instances non-volatile re-programmable memory works on a principle of charging. The use of a stored charge limits the environments the memory device can be used in because the charge can leak away quickly at elevated temperatures.

Other non-volatile re-programmable memory devices include a resistor that changes resistance through a phase change. These phase change memories are made in the back-end of the wafer fabrication process. The materials used are normally of a low molten point and phase change can take place at as low as 150° C. The low temperature of phase change results in difficulty in retaining data at an elevated temperature.

These and other matters have presented challenges to various memory applications and related devices.

Particular aspects of the present disclosure relate generally to a re-programmable non-volatile memory device wherein the memory state is related to the resistance level of the memory cell. The memory state of the memory cell is changed through a resistance change due to SiCr-facilitated migration. SiCr-facilitated migration refers to electrical-field driven migration and/or electromigration, wherein at least one element, possibly other than electromigration ions, migrates along the SiCr resistor.

In certain embodiments of the present disclosure, a memory device is provided. The memory device includes a first memory cell-access line terminating at a first node and a second memory cell-access line terminating at a second node. The memory device includes a memory cell resistor, made of a resistive material exhibiting reversibly-settable resistive states via SiCr-facilitated migration, and connected to and between each of the first and second nodes. The memory cell resistor can be a thin film resistor or a vertical resistor, for example. In certain embodiments the resistive material is Silicon Chromium (SiCr), includes SiCr, and/or is at least predominantly SiCr.

In certain embodiments a memory device includes a SiCr-based resistor configured to exhibit a first resistance state in response to a write current, and to exhibit a second resistance state in response to an erase current. The write and erase currents are of opposite directions and the first and second resistance states are set by SiCr-facilitated migration. The memory device includes programming circuitry configured to apply the write and erase currents to set the respective resistance states of the SiCr-based resistor. A read circuit is configured to apply a read current to the SiCr-based resistor to facilitate the detection of the resistance state of the resistor, the read current having a value that is insufficient to change the resistance state of the SiCr-based resistor. In certain embodiments the thermal-activation energy of the SiCr-facilitated migration process is high, for example around 2.5 eV.

In various embodiments of the present disclosure, a method for protecting the data stored in a memory device includes providing a memory device operatively coupled to control circuitry configured and arranged to access logic states stored within the memory device. A signal is generated for protecting the memory device from a potentially environmentally adverse condition involving a high temperature in which the control circuitry is known to fail. In response to the generated signal, the control circuitry is rendered in a protect mode that protects the control circuitry from the environmentally adverse condition. The logic states stored in the memory device are maintained while subjecting the memory device to the environmentally adverse condition. The protect mode is disabled in response to an indication that the environmentally adverse condition has dissipated, allowing the control circuitry to access the logic states stored in the memory device.

In certain embodiments of the present disclosure a memory device is a SiCr based resistor connected with interconnect metal lines and surrounded by inter-metal dielectrics on a substrate. In various embodiments inter-metal dielectrics are silicon-oxide materials such as those used in integrated circuits. In various embodiments the SiCr based resistor is a thin film resistor. In various embodiments the SiCr film can be applied to a semiconductor device in the backend of line (BEOL) portion of the wafer fabrication process. The device can be a single device memory cell. In various embodiments the memory cell can be integrated with a variety of integrated circuit technologies. For example, the SiCr based resistor can be used with silicon or with III-V compounds such as GaAs.

The disclosure may be more completely understood in consideration of the detailed description of various embodiments of the disclosure that follows in connection with the accompanying drawings as follows.

Figure 1A:
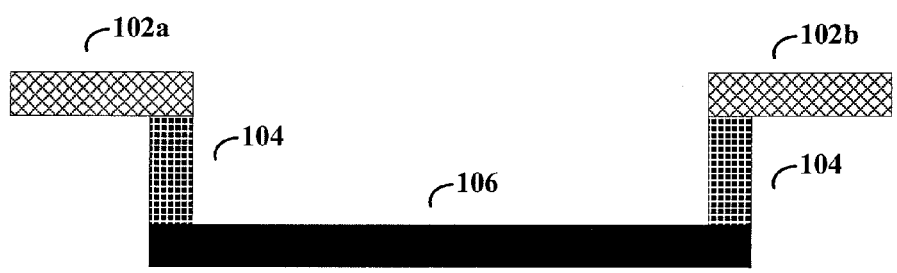
FIG. 1A depicts a memory cell consistent with an embodiment of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The present disclosure is believed to be useful for providing a heat and radiation resistant non-volatile re-programmable memory device, and the disclosure has been found to be particularly suited for use in arrangements and methods dealing with integrated circuitry. While the present disclosure is not necessarily limited to such applications, various aspects of the disclosure may be appreciated through a discussion of various examples using these contexts.

Various embodiments of the present disclosure are directed to a resistive memory device. In certain embodiments, the resistor is made of a SiCr based material. A single resistor works as a memory cell, allowing for high density of memories on an integrated circuit. A SiCr based resistor can be added to an integrated circuit in the backend portion of the wafer fabrication process. In specific embodiments, this allows for resistors to be layered to allow for 3D memory and increase in memory density.

In connection with the instant disclosure, it has been discovered that a resistor of SiCr based material can reversibly change resistance levels. The change in resistance occurs from Si migration in the same direction as the current flow, and the electrical fields. In certain other specific embodiments, the Si migrates because the Si is partially positively ionized. It has also been discovered herewith that small amounts of oxygen present in the SiCr based material migrate in the opposite direction of the current and the migrating Si material, and thus the same direction as the electrons. Such migration can be caused by electromigration or by the electrical field if the oxygen atoms are partially negatively ionized. Both migration processes have been found to be accelerated by high temperatures, due to Joule heating. In certain embodiments the observed resistance change is a result of the migration of both Si and Oxygen. One or both of the material migrations observed therewith can be considered as SiCr-facilitated migration, or electrical-field driven migration and/or electromigration.

In various embodiments, alternative and complementary materials exhibiting reversibly-settable resistive-states via SiCr-facilitated migration include various alloys such as SiCr, $Si_2Cr$, SiCr-based materials (optionally) doped with impurities concentrated to effect applications-specific results (including but not limited to altering the electromigration), and other materials that are at least predominantly composed of SiCr and also composed in more substance of other materials to effect applications-specific results and/or alter the manner in which SiCr-facilitated migration would otherwise be set if larger amounts of SiCr or pure SiCr were used as the material.

In other specific example embodiments, the SiCr based material has a composition of 70% Si and 28% Cr, by weight, plus approximately 2% of Oxygen as a dopant and residual gas. In another related embodiment, the dopant is a material other than Oxygen, and the ratio between Si, Cr and dopant varies widely. For example, the amount of Cr present in the material can vary from approximately 20% to approximately 33%. Changes in composition of the SiCr-based material are also used to affect and/or control the temperature coefficient of resistance (TCR) of the material.

In various other embodiments, a SiCr based thin film resistor is added to a semiconductor device during BEOL. This addition allows for the addition of the SiCr thin film resistor without involving the semiconductor substrate. A layer of dielectric material is laid on the substrate. In one such embodiment, the dielectric material is a silicon-oxide related material deposited from various precursors, such as $SiH_4$ or TEOS. In related variations, the dielectric material is doped or undoped and/or the dielectric material is silicon-nitride, a mixture of oxide and nitride (silicon-oxynitride), or other dielectric material used in the wafer fabrications of the IC industry. In a specific application, the SiCr thin film resistor is deposited, using sputtering, for example. The resistor is etched to the desired placement. A second dielectric layer is deposited, and vias (through holes) are etched into the dielectric layer at points corresponding to the ends of each of the etched resistors. A metal interconnect material, such as Tungsten or copper is deposited in the etched via, and as a metal interconnect layer. This metal interconnect layer can be etched to connect the resistor as desired. The process can be repeated multiple times to lay down a number of SiCr based thin film resistors. The SiCr based thin film resistors can be connected to metal interconnect layers above or below the resistor. This approach can yield a high density of resistors and therefore high-density memory cells. This backend processing can occur at relatively low temperatures, less than 350° C., for example. Further, because the resistors are added during the backend portion of wafer fabrication, the memory can be integrated with a wide variety of integrated circuit technologies, such as silicon, III-V compounds such as GaAs, or other semiconductor compounds such as silicon carbide.

In yet other embodiments, the BEOL process is based on Cu-based interconnect technologies. The BEOL process is a "duel damascene process." A dielectric material is laid on the substrate. The dielectric used can be low-K or ultra low-k dielectric, made mainly of $p-SiO_2$, SiOC, SiCOH or other materials. The SiCr film is deposited, using sputtering for example. The resistive film is patterned to the desired placement. The next dielectric layer is deposited. Vias (through holes) connecting the SiCr resistors with a Cu interconnect above it are formed. Trenches for the Cu interconnects are formed on the surface of the dielectric layer. Cu is deposited in the via holes and the trenches using Cu plating followed by Cu CMP. A cap layer of dielectric material is formed over the Cu interconnects. The process can be repeated to achieve multiple layers with SiCr based resistors. In embodiments with more than one resistor layer, holes can be etched to connect either the SiCr resistors above or below a Cu layer to the Cu interconnects.

In certain embodiments of the present disclosure a SiCr based resistor of a memory device is programmed with a current (voltage) pulse, and erased with a similar current pulse in the reversed current flow direction. The current pulse changes the resistance of the memory device due SiCr-facilitated migration. The current pulse can be of a few milliamperes of a few volts in milliseconds. The current flow works as the driving force of migration of elements along the SiCr resistor. The Joule heating effect of the current accelerates the electrical-field driven migration and/or electromigration processes. In certain embodiments the SiCr film changes resistivity by 20% or more. In certain embodiments a positive current pulse decreases the resistivity of the SiCr film. In various embodiments applying a current in the opposite direction returns the resistivity of the SiCr film to its original level.

In various embodiments the resistance of the single resistor is changed due to SiCr-facilitated migration. The basic structure of the device is a resistive film connected with metal lines and surrounded by inter-metal dielectrics such as those found in standard integrated circuits. A memory device is programmed by changing the resistance of the resistive film. Programming can be done with a current pulse of a few milliamperes of a few volts in milliseconds. The current flow works as the driving force of migration of elements along the film. The Joule heating effect of application of the current accelerates the electrical-field driven migration and/or the electromigration process. In certain embodiments the application of a current pulse changes (decreases, for example) the resistivity of the thin film resistor by 10%, in other embodiments the resistivity is changed by 20% or 30% or more.

In certain embodiments of the present disclosure, an erase of the memory device can be achieved when the same or similar current pulse as for the writing step is applied, but in the reverse current direction. During this current pulse the migration element in the programming step migrates back to where it came from, and the resistivity of the thin film resistor returns to its original level. The writing-erase cycle can be repeated again and again. In various embodiments the resistivity change process can be reversed if the current flow direction is reversed.

In various embodiments current pulse strength and/or duration can be varied. In such embodiments a single SiCr-based resistor can store multiple logic states. For example, applying a pulse of a first strength in duration can change the resistivity of the resistor by around 10% from the original resistance level. A second pulse can be applied to the SiCr-based resistor to increase the change in resistivity for the original resistance level by around 20%. The different amount of resistance change can be achieved by a different strength pulse, a different duration pulse, or a combination of both. In other embodiments a single strong pulse can change the resistance by around 20% instead of two individual pulses. In still other embodiments an additional pulse can be applied to increase the change in resistance level to around 30%. The difference in resistance levels of approximately 10% allow for differentiation of the logic state stored during the reading process. In various embodiments the logic states can be removed/and or leveled down by the application of a current in the opposite direction. For example, in certain embodiments a single large pulse can be applied to reset the resistance level of the SiCr-based resistor regardless of the final level stored in the memory cell. In other embodiments a pulse approximately equal in strength, but in the opposite direction of the last programming pulse, applied to the resistor will reverse the change in resistance level about the same amount as the previous pulse. For example, if a pulse was applied to change the resistivity of the SiCr-based resistor the equivalent of two levels, then a pulse of equal strength, but opposite direction will return the SiCr-based resistor to the resistivity prior to the two level pulse. In other embodiments a pulse of a certain strength applied in the opposite direction of the programming pulses will change the resistivity the equivalent of lowering the logic state by one level. This application of various strength pulses and durations of pulses allows for more information to be stored in less space since each SiCr-based resistor can store more than one logic state.

In certain embodiments reading of the data stored in the SiCr based resistor is done at a low current. The characteristics of the SiCr based material allow for any change of resistivity at a low current level to be minimal compared to the resistance change during the writing step. For example, SiCr has a low temperature coefficient of resistance (TCR) that is less than 100 ppm/° C. SiCr is also a hard alloy with a molten point above 1300° C. The thermal activation energy and the field/current acceleration effect of the SiCr-facilitated migration process are high. These characteristics, among others, allow for a change of resistance under the application of a strong current, while a low current barely changes the resistance level. Further, exposure to high levels of heat does not change the resistance level of a SiCr based resistor, allowing for the maintained storage of a logic state in the presence of prolonged elevated temperatures. For example, the resistive memory device is able to operate at temperatures above 300° C. Further, the memory cell is radiation resistive. The cell can maintain its stored logic state in the presence of high energy particles, X-rays, UV-light or visible light, for example.

In various embodiments, the thin film resistor is configured to maintain its resistance state at above 200° C. In other embodiments the resistor maintains its resistance state above 300° C. The resistor can be used with a heat resistant substrate, such as silicon carbide. The high temperature resistance allows the resistor to withstand temperature shocks, and may be particularly useful in flash devices.

In various embodiments, a memory device includes a signal generator, a resistor, and programming circuitry. The signal generator provides a signal to the programming circuitry to indicate a potentially environmentally adverse condition involving a high temperature in which the programming circuitry is known to fail. The programming circuitry includes a circuit to initiate a protect mode in response to a signal from the signal generator. The resistor maintains its stored logic state, by maintaining its resistance level, during the protect mode. The programming circuitry is unable to access the logic state stored in the resistor during the protect mode.

Turning to FIG. 1A, a resistor for use in a single cell memory device is disclosed, consistent with an embodiment of the present disclosure. A SiCr-based resistor 106 is connected at each end to vias 104, which connect metal interconnects 102a to one end of the resistor 106 and metal interconnect 102b to the other end of the resistor 106. Consistent with an embodiment of the present disclosure, the resistance level of resistor 106 is changed when a current pulse of sufficient strength is applied to metal interconnect 102a. In certain embodiments the current pulse has a strength of a few milli-amperes of a few volts applied for milliseconds. For example, a current pulse of approximately 4 mA at a few volts can be applied for 20-30 milliseconds. In other embodiments a pulse of 1-2 mA and less than several volts can be applied. In various embodiments a voltage pump is used in the application of the pulse. It has been discovered that the application of a strong current pulse to a SiCr-based resistor 106 alters the resistance level of the resistor 106 by 20% or more. The resistance of the SiCr-based resistor 106 is changed through a SiCr-facilitated migration process. A current pulse having the same or similar strength as the first current pulse can be applied to metal interconnect 102b to return the SiCr-based resistor 106 to its original resistance state. The SiCr-facilitated migration process is reversed through the application of a current pulse of the same or similar magnitude in the reverse direction.

In certain embodiments the change in resistance is a decrease in resistance. The decrease in resistance of the SiCr-based resistor stays when the current pulse is no longer applied to the SiCr-based resistor. In certain embodiments when the SiCr-based resistor 106 is used in a memory device, the change in resistance results in storage of a logic state. In certain embodiments a decreased resistance is equivalent to a logic state of 1. The logic state stored in the SiCr-based resistor 106 can be read by applying a current much smaller than the current required to change the resistance of the resistor to store the logic state. For example, a read current can be applied at interconnect 102a through vias 104 to one end of SiCr-based resistor 106. The current is received at metal interconnect 102b and provided to an output circuit (not pictured) for receiving the read signal after it has been applied to the SiCr-based resistor 106 and determining the logic state stored in the SiCr-based resistor 106.

Figure 1B:
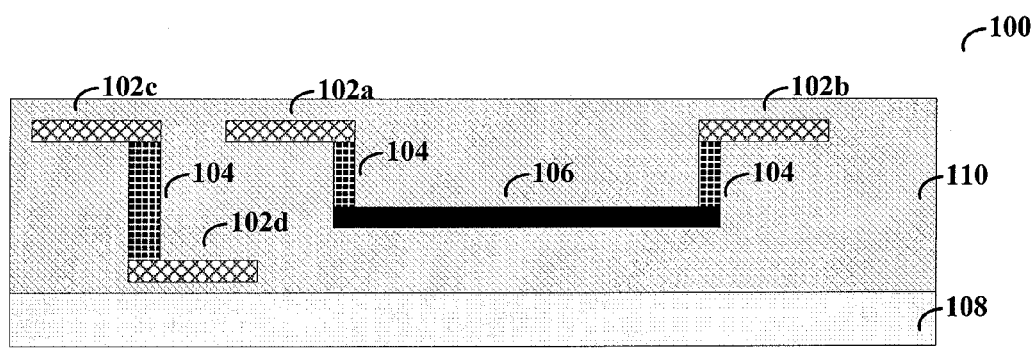
FIG. 1B depicts a memory resistor in an integrated circuit, consistent with an embodiment of the present disclosure.

FIG. 1B shows a SiCr-based resistor implemented in an integrated circuit device 100, consistent with an embodiment of the present disclosure. The device includes a substrate 108, including a semiconductor and possibly a portion of BEOL layer stack. The substrate 108 can be a silicon-based substrate. In other embodiments there can be another semiconductor-based substrate such as silicon carbide or an III-V semiconductor compound such as GaAs. The metal interconnects 102, vias 104 and SiCr-based resistor 106 are deposited on the substrate during BEOL. Between the linked interconnects 102, vias 104 and SiCr-based resistors 106 is dielectric material 110. In certain embodiments multiple levels of interconnects 102, as well as multiple levels of SiCr-based resistor 106 can be deposited during the backend process.

Figure 2A:
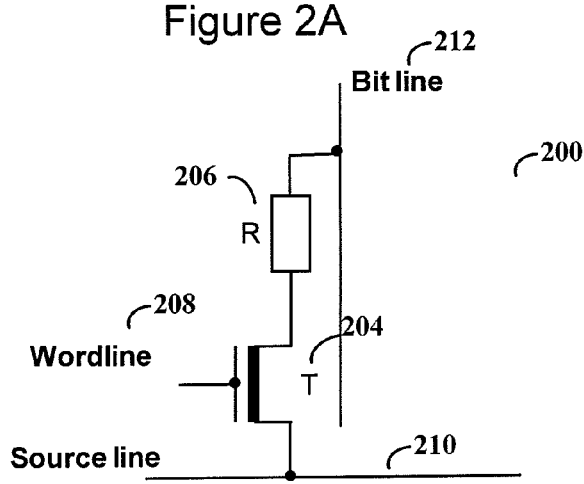
FIG. 2A depicts a one transistor, one resistor memory cell, consistent with an embodiment of the present disclosure.

FIG. 2A shows a memory cell 200 having a single transistor 204 and a single resistor 206 forming a memory cell consistent with an embodiment of the present disclosure. Resistor 206 can be a thin film resistor or a vertical resistor, for example. The transistor 204 has a word line 208 attached to its gate, a source line 210 attached to its source, and the transistor 204's drain is attached to one end of SiCr-based resistor 206. The other end of SiCr-based resistor is attached to a bit line 212. In order to program the memory cell 200, the resistance of resistor 206 is changed through SiCr facilitated migration. This is achieved by applying a voltage Vprog to bit line 212, setting the word line 208 voltage to high, so the gate of the transistor opens, allowing for current flow, and setting source line 210 to 0V. In such an arrangement current flows from the bit line 212 through resistor 106 towards 0V at source line 210. Inverse programming, or erasing, is achieved by setting bit line 212 to 0V, word line 208 is set to a voltage high enough that the gate of the transistors opens, and source line 210 is set to Vprog. Reading of the value stored in the memory cell is achieved by setting bit line 212 to Vread, word line 208 to Vwl-read, and the source line 210 to ground. In various embodiments of the present disclosure the value of Vprog is the voltage necessary to change the resistance value of the SiCr-based resistor 206 by at least 10%. In certain embodiments the resistance of the SiCr-based resistor 206 is changed up to 30%. In contrast, the voltage Vread is relatively small, and has a low current level.

Figure 2B:
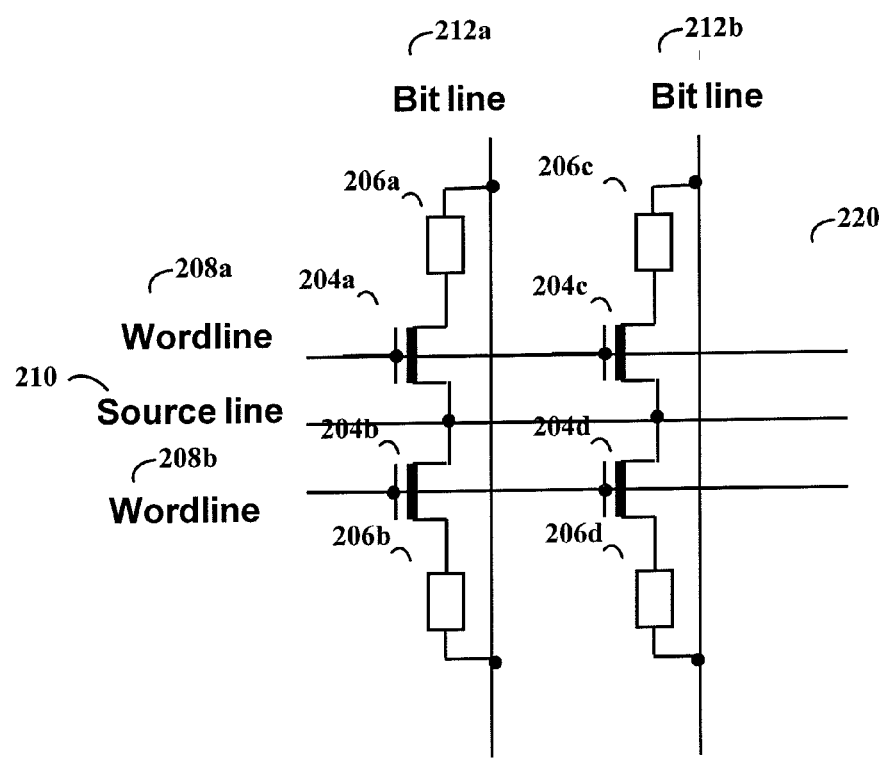
FIG. 2B depicts a 2×2 NOR memory array, consistent with an embodiment of the present disclosure.

FIG. 2B depicts four memory cells arranged in a 2×2 NOR memory array 220 consistent with an embodiment of the present disclosure. Each memory cell is arranged in a similar fashion to those illustrated in FIG. 2A. The programming and inverse programming of each individual memory cell is achieved as described above. In various embodiments and implementations it can be desirable to only program some, but not all, of the interconnected memory cells. When programming the memory cells 200 in memory array 220 the bit line 212 is floating or set to 0V for memory cells that are not selected, and/or the word line 208 is set to 0V for non-selected memory cells 200. Similarly, during inverse programming the bit line 212 is floating or to Vprog for memory cells 200 that are not selected, and/or the word line 208 is set to 0V for memory cells 200 not selected. This allows for each memory cell to be programmed individually. As depicted in FIG. 2B, the bit lines 212a and 212b connect the memory cells 200 of a particular column, and the word lines 208a and 208b connect the memory cells 200 of a particular row. This allows for selection of a memory cell based on its column and row designation. It also allows for the expansion of the array to include more than four memory cells. In certain embodiments the memory cells are arranged in an AND memory array. In such embodiments (not shown) the array includes two separate source lines, one for each column.

Figure 3A:
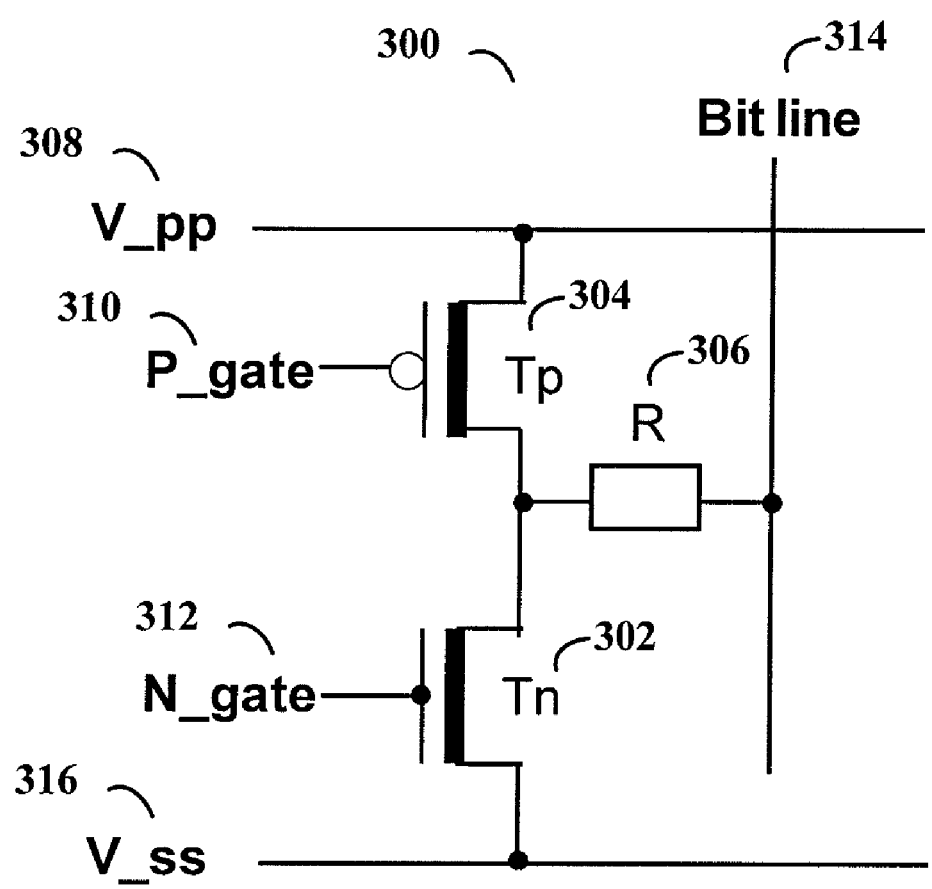
FIG. 3A depicts a memory cell consisting of two transistors and one resistor element, consistent with an embodiment of the present disclosure.

FIG. 3A depicts a memory cell having a single SiCr-based resistor 306 and two transistors 302 and 304, consistent with an embodiment of the present disclosure. The V_ss line 316 is set to ground and the V_pp line 308 is set to Vprog, except during reading of the stored logic state, in which case V_pp is set to Vdd. Programming of the memory cell 300 is achieved by setting the P_gate line 310 of Tp transistor 304 to high as well as the N_gate line 312 of Tn transistor 302 to high. This causes the N gate of transistor 302 to be open while the P gate of the transistor 304 is closed. Bit line 314 is set to Vprog. This allows for current to flow from bit line 314, through resistor 306 and towards ground. Vprog is chosen to be sufficiently high that the flow of current through resistor 306 causes the resistance of resistor 306 to change by at least 10%, for example. The change in resistance to resistor 306 is achieved through SiCr-facilitated migration, and remains when current is not actively flowing through the resistor. Inverse programming, or erasing, occurs through a current flow of the same or similar magnitude, but in the reverse direction. This is achieved by setting the N_gate line 312 of transistor 302 and the P_gate line 310 of transistor 304 to low and the Bit line 314 to ground. Setting the transistor gates to low causes the N_gate of transistor 302 to close and the P_gate of transistor 304 to open. Since V_pp 308 is set to Vprog and the bit line 314 current flows from V_pp through transistor 304 and through resistor 306 towards bit line 314, which is the opposite direction of flow through resistor 306. To read the logic value stored in the memory cell 300, the bit line is set to V_bl_read, which is a voltage level lower than Vprog that does not affect the resistance of the resistor 306 to a noticeable level as compared to the application of Vprog. Further V_pp 308, N-gate and P-gate are all set to Vdd. In various embodiments of the disclosure the two transistors are different transistors, one an nMOS transistor and one a pMOS transistor.

Figure 3B:
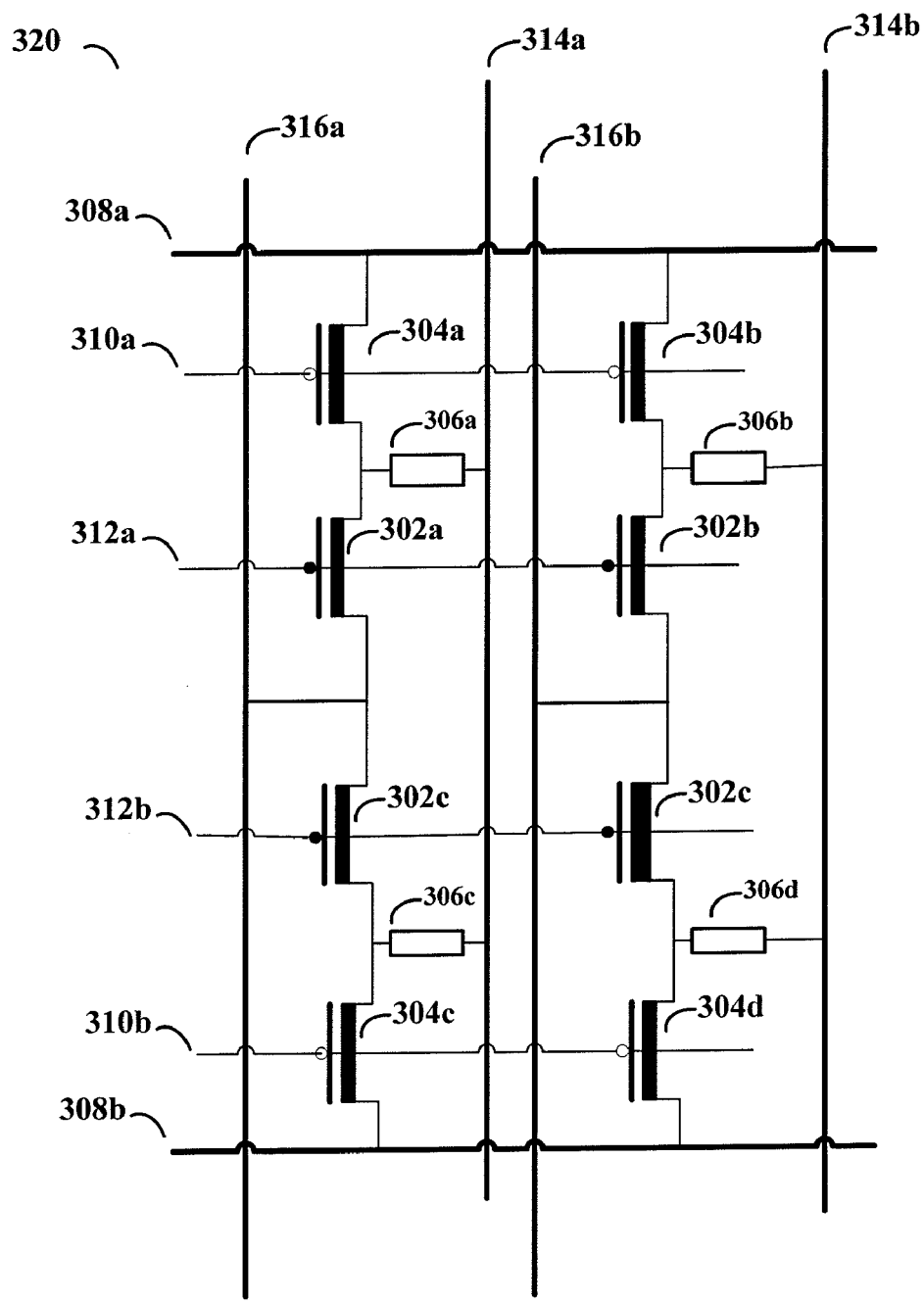
FIG. 3B depicts a 2×2 AND memory array, consistent with an embodiment of the present disclosure.

FIG. 3B depicts an AND memory array 320 made of four memory cells 300 with two transistors and one resistor, consistent with an embodiment of the present disclosure. In the AND array 320, the columns of memory cells are connected both by a bit line 314 and a V_ss line 316. In an alternative AND memory array (not shown) the memory cells of each column can be connected by a bit line 314 and a V_pp line 308. In the AND memory array depicted the memory cells are connected by V_pp lines 308a and 308b. The N_gate lines 312a and 312b and P_gates lines 310a and 310b further connect portions of the memory cell along the rows. In other embodiments (not depicted) the memory cells 300 can be arranged in a NOR memory array. This is achieved by the only connection of the memory cells of a column being through the bit lines 312. In such an embodiment both the V_pp lines and the V_ss lines connect memory cells along rows. Similar to the memory array 220 using a memory cell 200 consisting of a single resistor and a single transistor, a single memory cell 300 can be isolated for read/write/or erase procedures due to the column/row connections. Further, an array larger than 2×2 can be implemented in various embodiments.

Figure 4:
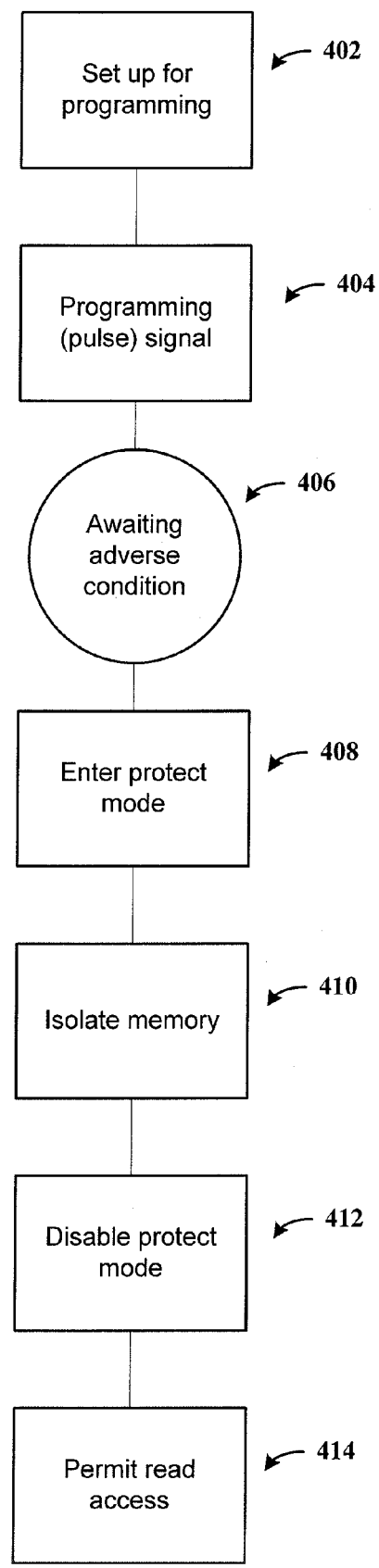
FIG. 4 depicts a flow diagram consistent with an embodiment of the present disclosure.

FIG. 4 depicts a method of operating the memory device consistent with an embodiment of the disclosure. In step 402 a memory cell or memory cell array, as described above with respect to FIGS. 1-3 for example, is operatively coupled to control circuitry configured and arranged to access logic states stored within the memory device. In step 404 the control circuitry sends a signal to the memory device containing information to be stored. In certain embodiments the control circuit provides various currents and voltages to the bit lines, word lines, and source lines of the memory array to store various logic states in each memory cell. In step 406 a signal is generated when an environmentally adverse condition is detected. The signal is generated when a condition is detected under which the control circuitry is known to fail. In step 408 in response to the generated signal, the control circuitry is in a protect mode that protects the control circuitry from the environmentally adverse condition. In step 410 the logic states stored in the memory device are maintained while the memory device is subjected to an environmentally adverse condition, such as a spike in temperature. In step 412 the protect mode is disabled once it has been indicated that the environmentally adverse condition has dissipated. This allows the control circuit to access the stored logic states in the memory device. In step 414 the control circuitry accesses the stored logic states in the memory device. In certain embodiments this is achieved by applying a current significantly smaller than the one used to program the memory cells, to each cell from which information is desired. In step 414 the memory device is reprogrammed to store new logic states. This can be achieved by applying currents and voltages similar to the ones used in the programming in step 404. In various embodiments the environmentally adverse condition is a high temperature condition. The high temperature condition can be above 200° C. In other embodiments it can be above 250° C. or above 300° C. In various embodiments the control circuitry is unable to access the stored logic states during protect mode.

Any of the memory arrays can be implemented with appropriate programming circuitry to apply the appropriate voltages to each of the lines in order to change the resistance state of the memory resistor to represent the desired logic state. In various embodiments, such programming circuitry can be part of a larger control circuit including a reading circuit for determining the value stored in the memory resistor. The memory arrays and control circuitry can be used in a variety of applications. The memory arrays can be used in applications requiring non-volatile re-programmable memory that will be subject to high temperatures or high levels of radiation. For example, the memory device can be used in electronic devices and computers that are prone to overheating. The memory device can also be used for field or other equipment routinely stored or used in areas without climate control.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, embodiments with a large array of memory cells can be useful for certain implementations. Further, the programming circuitry responsible for the application of various voltages to each word line, bit line and source line can be implemented in a variety of ways. In view of the description herein, those skilled in the art will recognize that many changes may be made thereto without departing from the spirit and scope of the present disclosure.

The invention claimed is:

1. A memory device comprising:
    a first memory cell-access line terminating at a first node;
    a second memory cell-access line terminating at a second node;
    a memory cell resistor, connected to and between each of the first and second nodes, including a resistive material for storing different resistance states respectively corresponding to different resistance values set by SiCr-facilitated migration in response to energy presented between the first and the second nodes.

2. The device of claim 1, further including a semiconductor substrate, and wherein the memory cell resistor is implemented as a film on the semiconductor substrate.

3. The device of claim 1, further including a semiconductor substrate, and wherein the memory cell resistor is implemented as a vertical resistor in the semiconductor substrate.

4. The device of claim 1, wherein a signal applied to the first node of the memory cell resistor forces the migration of a material along the memory cell resistor to set the resistance value of the memory cell resistor, and heats the memory cell resistor via a Joule heating effect to accelerate the SiCr-facilitated migration.

5. The device of claim 1, wherein the memory cell resistor has a high molten point above 1300° C.

6. The device of claim 1, wherein the memory cell resistor is configured to maintain its resistance state at a temperature above 200° C.

7. The device of claim 1, wherein the memory cell resistor is a SiCr-based resistor.

8. The memory device of claim 1, further including programming circuitry configured to apply write and erase currents to force the migration of a material along the memory cell resistor to set the resistance state of the memory cell resistor.

9. The memory device of claim 1, wherein the SiCr-facilitated migration includes both electromigration and electrical field driven migration.

10. The memory device of claim 1, wherein the SiCr-facilitated migration includes electrical field driven migration of at least one element, other than electromigration-transported ion, migrates along the SiCr-based resistor in the same direction as the electrical field.

11. The memory device of claim 1, where the SiCr-facilitated migration includes electromigration.

12. A memory device comprising:
    a SiCr-based resistor configured to exhibit a first resistance state in response to a write current, and to exhibit a second resistance state in response to an erase current, the write and erase currents being of opposite direction and the first and second resistance states set by SiCr-facilitated migration;
    a programming circuit configured to apply the write and erase currents to set the respective resistance states of the SiCr-based resistor; and
    a read circuit configured to apply a read current to the SiCr-based resistor to facilitate the detection of the resistance state of the resistor, the read current having a value that is insufficient to change the resistance state of the SiCr-based resistor.

13. The device of claim 12, wherein the programming circuit includes
    a write circuit configured to apply the write current to the SiCr-based resistor to program the resistor by setting the resistor in the first resistance state, and
    an erase circuit configured to apply the erase current to the SiCr-based resistor to erase the resistor by setting the resistance state of the resistor in the second resistance state.

14. The device of claim 12, further including an output circuit configured to provide an output of the applied read current as passed through the resistor to facilitate the detection of the resistance state of the SiCr-based resistor for detecting the corresponding logic state of the device.

15. The device of claim 12, wherein the SiCr-based resistor is a thin film resistor configured to maintain its resistance state at a temperature above 200° C.

16. A method comprising
    providing a memory device operatively coupled to control circuitry configured and arranged to access logic states stored within the memory device;
    generating a signal used for protecting the memory device from a potentially environmentally adverse condition involving a high temperature in which the control circuitry is known to fail;
    in response to the generated signal, rendering the control circuitry in a protect mode that protects the control circuitry from the environmentally adverse condition;
    maintaining storage of the logic states while subjecting the memory device to the environmentally adverse condition;
    in response to an indication the environmentally adverse condition has dissipated, disabling the protect mode and causing the control circuitry to access the logic state in the memory device; and
    storing logic states within the memory device, wherein storing a first logic state includes providing a write current to a SiCr-based resistor, the write current changing the resistance level of the SiCr-based resistor from a first resistance level to a second resistance level through SiCr-facilitated migration, wherein the SiCr-facilitated migration includes both electromigration and electrical field driven migration.

17. The method of claim 16, wherein the high temperature is above 200° C.

18. The method of claim 16, wherein storing logic states further includes storing a second logic state by providing an erase current to the SiCr-based resistor, the erase current changing the resistance level of the SiCr-based resistor from the second resistance level to the first resistance level through SiCr-facilitated migration.

19. The method of claim 16, wherein accessing logic states stored in the memory device includes applying a read current to facilitate the detection of the resistance state of a SiCr-based resistor, the read current having a value that is insufficient to change the resistance state of the SiCr-based resistor.

\* \* \* \* \*